(12) United States Patent
Driessen et al.

(10) Patent No.: US 10,234,519 B2
(45) Date of Patent: Mar. 19, 2019

(54) ELECTRIC POWER CONVERTER AND MRI SYSTEM COMPRISING SUCH CONVERTER

(71) Applicant: Prodrive Technologies B.V., Eindhoven (NL)

(72) Inventors: Antonius Wilhelmus Hendricus Johannes Driessen, Groningen (NL); Noud Johan Hubert Slaats, Eindhoven (NL)

(73) Assignee: Prodrive Technologies B.V. (NL)

( * ) Notice: Subject to any disclaimer, the term of this patent is extended or adjusted under 35 U.S.C. 154(b) by 233 days.

(21) Appl. No.: 15/234,136

(22) Filed: Aug. 11, 2016

(65) Prior Publication Data

US 2017/0045596 A1  Feb. 16, 2017

(51) Int. Cl.
| | |
|---|---|
| *G01R 33/385* | (2006.01) |
| *H02M 1/38* | (2007.01) |
| *H02M 7/49* | (2007.01) |
| *H02M 7/5387* | (2007.01) |
| *H02M 1/14* | (2006.01) |

(Continued)

(52) U.S. Cl.
CPC .......... *G01R 33/3852* (2013.01); *H02M 1/14* (2013.01); *H02M 1/38* (2013.01); *H02M 7/46* (2013.01); *H02M 7/49* (2013.01); *H02M 7/537* (2013.01); *H02M 7/5387* (2013.01); *H02M 2001/385* (2013.01)

(58) Field of Classification Search
CPC .... G01R 33/3852; H02M 7/537; H02M 7/46; H02M 1/14; H02M 7/5387; H02M 7/49; H02M 1/38; H02M 2001/385

USPC .......................................... 324/300, 318, 322
See application file for complete search history.

(56) References Cited

U.S. PATENT DOCUMENTS

| | | | |
|---|---|---|---|
| 6,774,639 B1 * | 8/2004 | Unsworth .......... | G01R 31/1227 324/535 |
| 7,286,375 B1 | 10/2007 | Welchko | |

(Continued)

FOREIGN PATENT DOCUMENTS

EP    2 800 265 A1    5/2014

OTHER PUBLICATIONS

J.M. Schellenkens, et al "Dead-Time Compensation for PWM Amplifiers using Simple Feed-forward Techniques"; XIX International Conference on Electrical Machines (ICEM), 2010.

(Continued)

*Primary Examiner* — Giovanni Astacio-Oquendo
(74) *Attorney, Agent, or Firm* — Varnum, Riddering, Schmidt & Howlett LLP

(57) ABSTRACT

The present specification relates to an electric power converter, comprising at least a set of four controllable power switches, arranged in an H-bridge or a functionally equivalent circuit comprising two switching legs of two series switches connected to a voltage source, each power switch comprising an antiparallel diode, a controller configured for controlling the switches with a blanking time, a feedback loop for the load current, characterized by a first bias current injection circuit, coupled to the central point of the first leg of the H-bridge and a second bias current injection circuit, coupled to the central point of the second leg of the H-bridge. The specification further relates to a MRI scanner, provided with an electric power converter according to any of the preceding claims, for driving the gradient coils.

4 Claims, 10 Drawing Sheets

(51) Int. Cl.
*H02M 7/46* (2006.01)
*H02M 7/537* (2006.01)

(56) References Cited

U.S. PATENT DOCUMENTS

| | | | |
|---|---|---|---|
| 7,532,012 B2* | 5/2009 | Cern | G01R 31/1272 324/536 |
| 7,676,333 B2* | 3/2010 | Younsi | G01R 31/1227 324/458 |
| 2016/0056798 A1* | 2/2016 | Chan | G05F 1/56 327/108 |
| 2016/0072434 A1* | 3/2016 | Wachi | H03B 5/24 331/117 FE |
| 2016/0217832 A1* | 7/2016 | Jayaraman | G11C 7/065 |

OTHER PUBLICATIONS

Tomoyuki Mannen and Hideaki Fujita, et al "Dead Time Compensation Method Based on Current Ripple Estimation"; IEEE Energy Conversion Congress and Exposition, 2013.

* cited by examiner

ELECTRIC POWER CONVERTER AND MRI SYSTEM COMPRISING SUCH CONVERTER

TECHNICAL FIELD

The present specification relates to an electric power converter and to a magnetic resonance imaging (MRI) system comprising such converter. In particular, the specification relates to an electric power converter, configured for compensation of a so called blanking-time error. Blanking-time compensation is typically applied to power converters used for driving the gradient coils in an MRI system.

BACKGROUND

Gradient coils in an MRI system serve for providing a magnetic field that is used for performing imaging measurements, and require a high voltage and high current that must be controlled. This voltage is typically in the order of 2000V and above. The required peak current is in the order of 600 A and above. To obtain detailed MRI images, the current must accurately and repeatedly follow a reference. The voltage and current for powering the gradient coils are provided by a power electronic circuit, comprising switching elements arranged in so called switching legs, together forming an H-bridge. These power electronic circuits with switching legs require a blanking time, i.e. a time wherein all switches of a leg are opened at the same time, which causes problems for accurately tracking of the reference at low output currents.

To generate the high output voltage and high output current a single H-bridge or stacked H-bridge multi-level power converter with output filter is typically used. For instance a single H-bridge with IGBT switches with anti-parallel diodes, or instead in principle any electronically controlled switch with a parallel diode can be used. The switches are controlled with a pulse width modulation scheme suitable for an H-bridge (for example unipolar or bipolar PWM). A stacked H-bridge with output filter consists of multiple H-bridges placed in series with an output filter. Where each H-bridge cell can be a basic H-bridge as described above, but can also be any functionally equivalent circuit composed by two switching legs of two series switches connected to a voltage source. Such a functionally equivalent circuit is a dV/dt filtered H-bridge. The output current of the converter flowing through a load will be referred to as the load current in the rest of this patent description.

The pulse width modulation scheme of the switches also includes a blanking time (dead time). This blanking time is a time where both top switches and bottom switches (in other words: all switches of one leg) are commanded to be off. This blanking time is added to prevent short circuiting the voltage source (shoot through) due to the turn-on and turn-off delays of the switches. Due to the required margins on the blanking time, there is a moment where both the top and bottom switch of a single switching leg are off, during this time the output voltage of the H-bridge is determined by the sign of the current in each switching leg, as this determines which parallel diodes will conduct. This current dependent output voltage has a negative effect on the converter output signal quality. The effect also generates a dead-band in the response of the output voltage/current on a changing control signal, specifically at low load currents. When using more H-bridge cells the effect of the blanking time becomes larger as each H-bridge cell requires a certain blanking time. To provide the required output quality (voltage/current waveform) to the gradient coils in an MRI application, the load current is typically controlled in closed-loop with a feedback circuit. The load current is measured and compared to a reference signal; based on the error the switching signals are changed to reduce the error. Because of the dead-band at low output currents, the output current is difficult to control, providing a poor output quality with a large error between the load current and the reference signal.

This problem is addressed in the prior art, in the international patent application WO2013/046099 for instance methods are proposed to compensate for the blanking time error by calculated compensation, while the international patent application WO2012/020363 suggests online adaptive model simulation. In the U.S. Pat. No. 6,535,402 the required compensation for the switching signals is determined based on the measured sign of the output current. The proposed methods provide model and measurement based compensation, which relies on measurements and knowledge of variable parasitic component parameters, limiting the performance of these methods.

SUMMARY

It is a goal of the present specification to provide an electric power converter and MRI system comprising such converter overcoming the above disadvantages of the prior art. The specification thereto proposes an electric power converter, comprising at least a set of four controllable power switches, arranged in an H-bridge or a functionally equivalent circuit comprising two switching legs of two series switches connected to a voltage source, a controller configured for controlling the switches with a blanking time and having a feedback loop for the load current and a first bias current injection circuit, coupled to a central point of the first switching leg of the H-bridge; and a second bias current injection circuit, coupled to a central point of the second switching leg of the H-bridge. Preferably, each power switch comprises an antiparallel diode.

Since the present specification relates to a bias current injection circuit used to force the direction of the current of each switching leg of the H-bridge, no measurements or exact knowledge of parasitic component parameters is required. By forcing a known current direction in each switching leg of the H-bridge, there is no blanking time error at low load currents, resulting in zero dead band and good control at low load currents. Because of the limited magnitude of the bias current, the blanking time error is shifted to a higher load current magnitude (both positive and negative). This however is no problem as the system gain is increased at higher currents, and the closed loop feedback control system can therefore compensate the error In an embodiment, the electric power converter comprises a dV/dt filter, the filter comprising a first inductor, coupled between the central point of the first leg of the H-Bridge; and a second inductor, coupled between the central point of the second leg of the H-Bridge. The dV/dt filter may further comprise at least one filter capacitor and/or four diodes arranged in an H-bridge configuration.

In a preferred embodiment, the first and second current injection circuits are configured for injecting a known bias current into the respective leg. This bias current of the current sources may be controlled such that the leg switching moments are defined during the blanking time at low load currents.

In principle the injection circuit is constructed with a current source connected to the middle node (switch node) of the series connection of two switches (switching leg) in the H-bridge. Therefore, each H-bridge requires two current sources to compensate each switching leg. The output current of the current source is configured such that the switching moments are defined during the blanking time at low load currents. A leg current is defined which is the current flowing into the leg. With a low load current, the sum of the bias current and leg current, is negative at the transition from a conducting bottom switch to a conducting top switch and is positive at the transition from a conducting top switch to a conducting bottom switch. To simplify implementation of the current source, the current source can also be split up into two current source, each providing a unipolar output current.

The bias current of the current sources is preferably controlled such that the sum of the bias current and a current resulting from a voltage applied to a load via the H-bridge is negative at a the transition from a conducting bottom switch to a conducting top switch and is positive at the transition from a conducting top switch to a conducting bottom switch.

In a practical embodiment the current source may comprise a series connection of a positive current source and a negative current source, of which the central point is coupled to the central point of the corresponding leg of the H-bridge.

A possible implementation of the current source with circuit elements may comprise a series switch is added to the output of each current source to prevent a short circuit of the supply voltage UDC through the anti-parallel diode in the switches used in the current source. A comparator on the switch node voltage can be used to determine the switching moment between the positive and negative current source. Freewheeling diodes are added to the output of the current source to provide a path when the series switch of the current source is switched off. By applying the proposed bias current injection, the blanking time error and blanking time induced dead band are removed at low output currents, simplifying the closed loop feedback control of the high precision amplifier. At higher output current the errors can be compensated by the closed loop feedback control system, resulting in an overall increased output quality, e.g. less difference between the load current and reference signal. Additionally this reduces the filter current ripple and consequently the load voltage and current ripple of the amplifier. When the amplifier is used in an MRI application for driving the gradient coils, the image quality can be improved.

BRIEF DESCRIPTION OF THE DRAWINGS

The specification will now be elucidated into more detail with reference to the figures, wherein.

DETAILED DESCRIPTION

Figure 1:
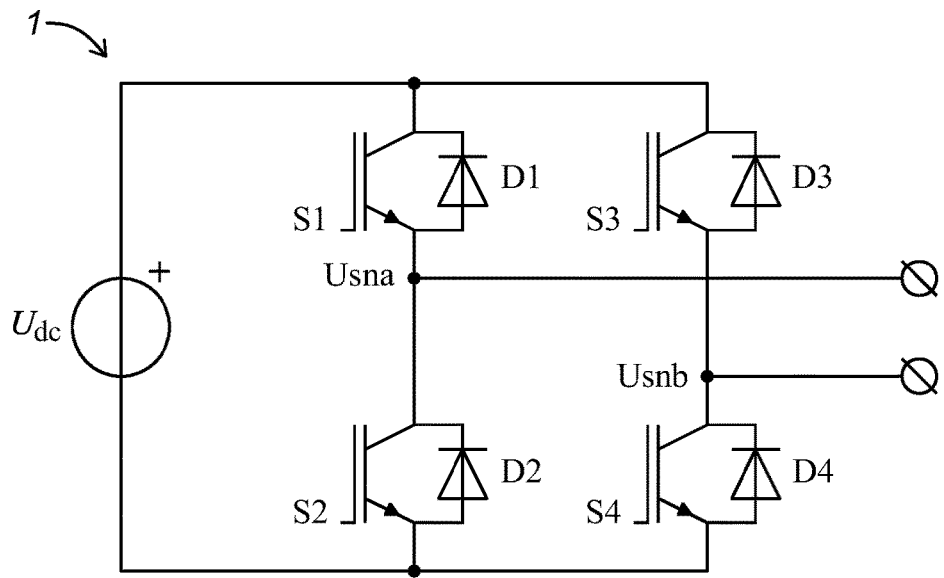
FIG. 1 shows an H-bridge according to the state of the art.

FIG. 1 shows a single H-bridge 1 with IGBT switches with parallel diodes D1 to D4 according to the state of the art. The switches are indicated with S1 to S4. The bridge is connected to a voltage source indicated by UDC. The switches are controlled with a pulse width modulation scheme suitable for an H-bridge (for example unipolar or bipolar PWM). The switches are IGBT switches with parallel diodes but instead in principle any electronically controlled switch with a parallel diode can be used.

Figure 2:
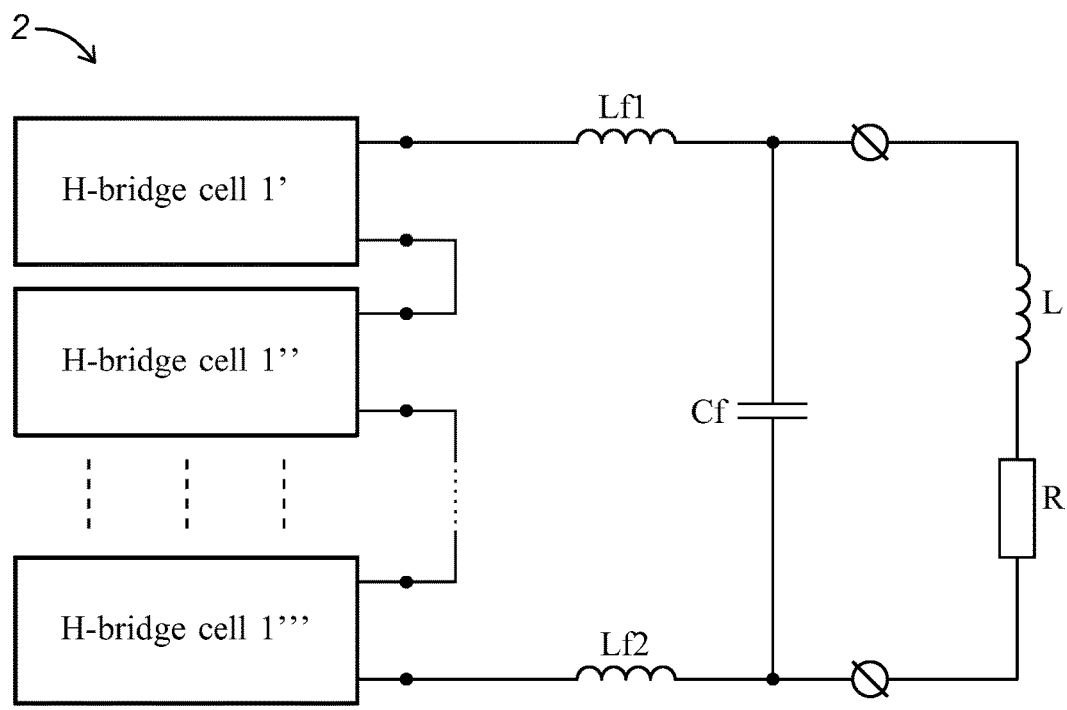
FIG. 2 shows a stacked H-bridge with LC output filter and load according to the state of the art.

FIG. 2 shows a stacked H-bridge 2 with output filter consists of multiple H-bridge cells 1', 1"-1"' placed in series with an output filter comprising Lf1, Lf2 and Cf. Where each H-bridge cell can be a basic H-bridge as described above as shown in FIG. 1, but can also be any functionally equivalent circuit composed by two switching legs of two series switches connected to a voltage source.

Figure 3:
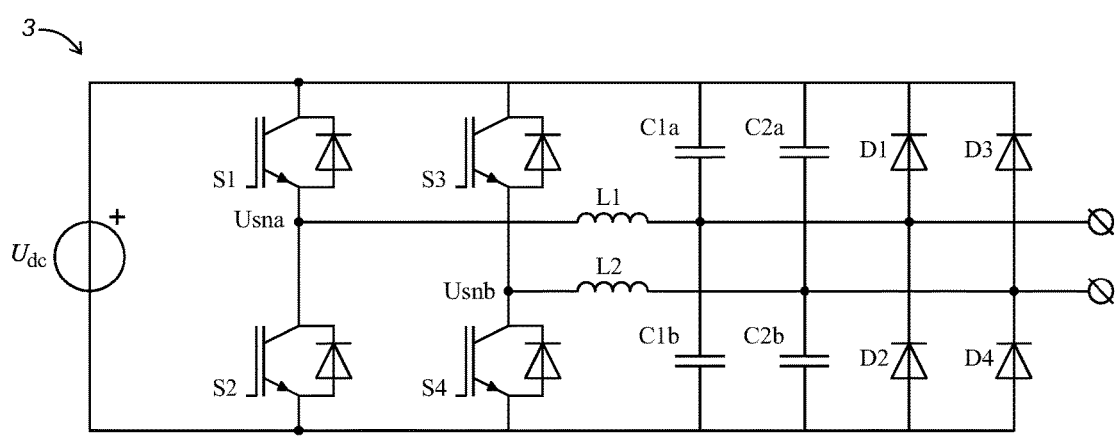
FIG. 3 shows an H-bridge with a dV/dt filter according to the state of the art.

FIG. 3 shows such a functionally equivalent H-bridge cell 3 is, a dV/dt filtered H-bridge. The output connection terminals U1, U2 of the converter are indicated by a circle with a diagonal line through it, these output connections connect to the load represented by the series connection of "L" and "R".

Figure 4:
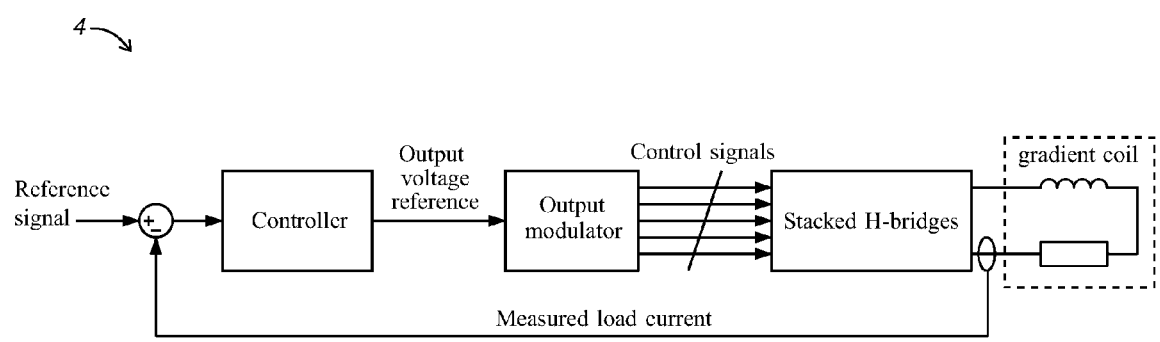
FIG. 4 shows a control system according to the state of the art.

FIG. 4 shows a feedback circuit 4 for controlling the load current in a closed-loop providing the required output quality (voltage/current waveform) to the gradient coils in an MRI application. The load current is measured and compared to a reference signal; based on the error the switching signals are changed to reduce the error. Because of the dead-band at low output currents, the output current is difficult to control, providing a poor output quality with a large error between the load current and the reference signal.

Figure 5:
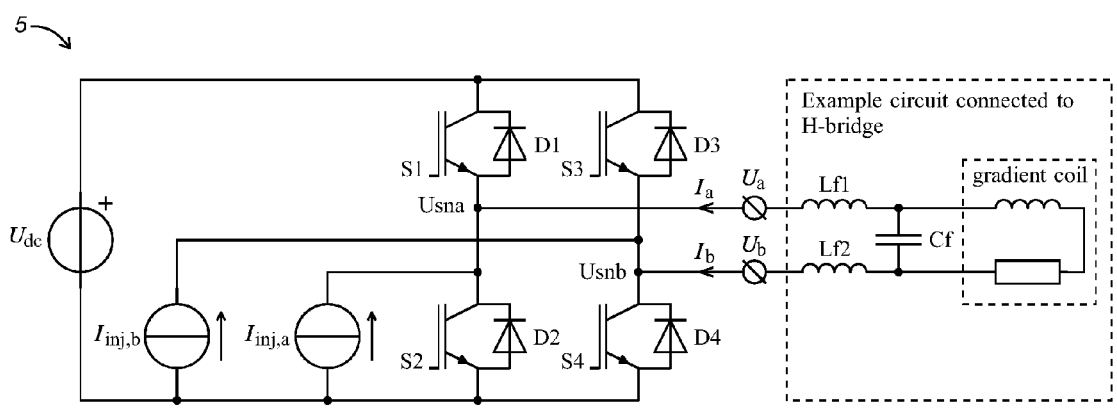
FIG. 5 shows an H-bridge according to a first embodiment of the specification.

FIG. 5 shows an electric power converter 5 according to the present specification, comprising at least a set of four controllable power switches S1-S4, arranged in an H-bridge, each power switch comprising an antiparallel diode D1-D4, a controller with blanking time, a feedback loop for a load current Ia, Ib, a first bias current injection circuit Iinj,a, coupled to the central point of the first leg of the H-bridge and a second bias current injection circuit Iinj,b, coupled to the central point of the second leg of the H-bridge.

Figure 6:
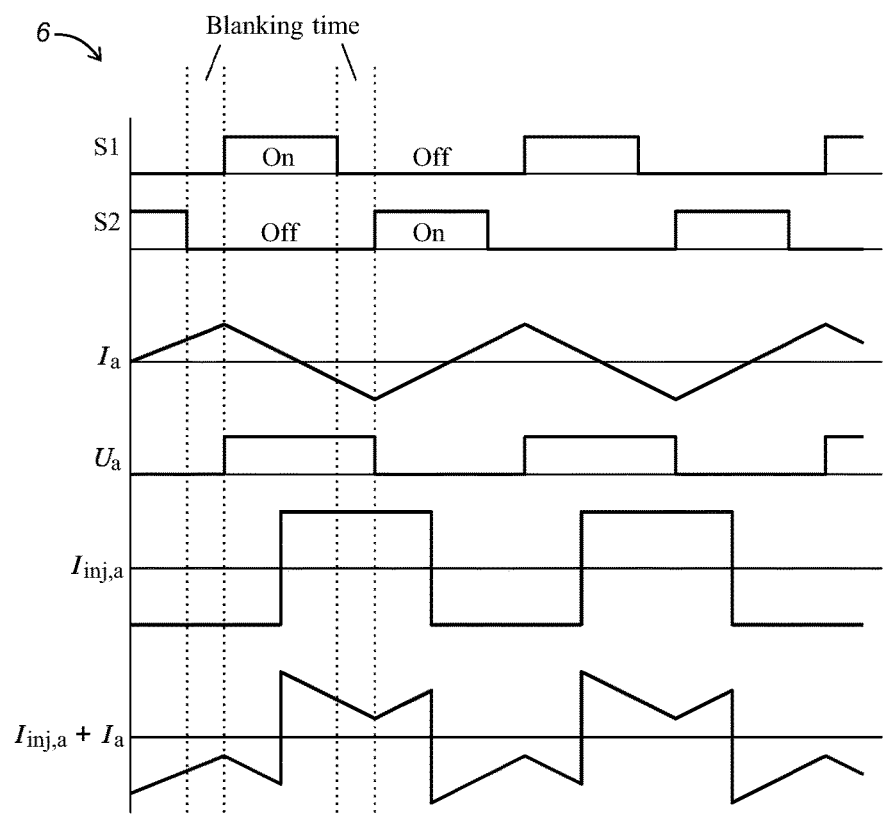
FIG. 6 shows waveforms corresponding to the H-bridge from FIG. 5.
Figure 7:
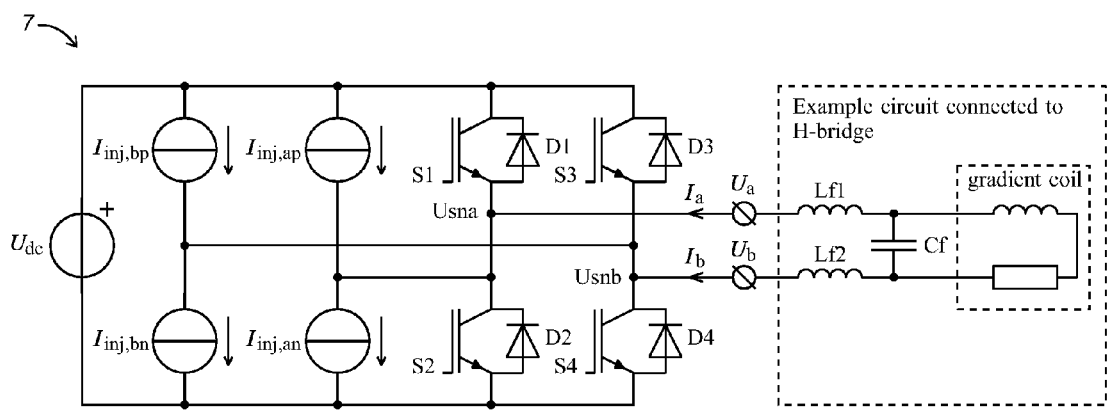
FIG. 7 shows an H-bridge according to a second embodiment of the specification.

FIG. 6 shows example waveforms 6 for the current source and FIG. 7 shows a simplified implementation 7 of the current source, split up into two current source, each providing a unipolar output current.

Figure 8:
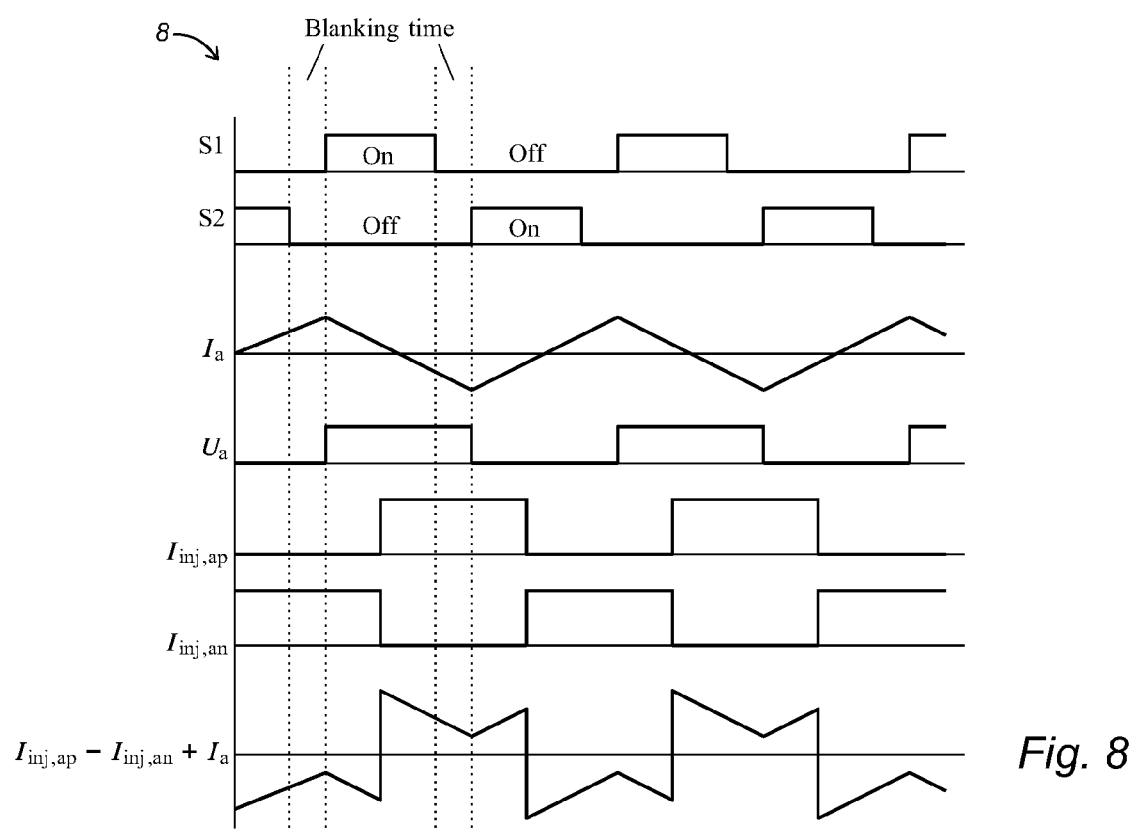
FIG. 8 shows waveforms corresponding to the H-bridge from FIG. 7.

FIG. 8 gives example current waveforms 8 for the circuit shown in FIG. 7. The bias current of the current sources is controlled such that the sum of the bias current and a current resulting from a voltage applied to a load via the H-bridge is negative at a the transition from a conducting bottom switch (S2 or S4) to a conducting top switch (S1 or S3) and is positive at the transition from a conducting top switch to a conducting bottom switch.

Figure 9:
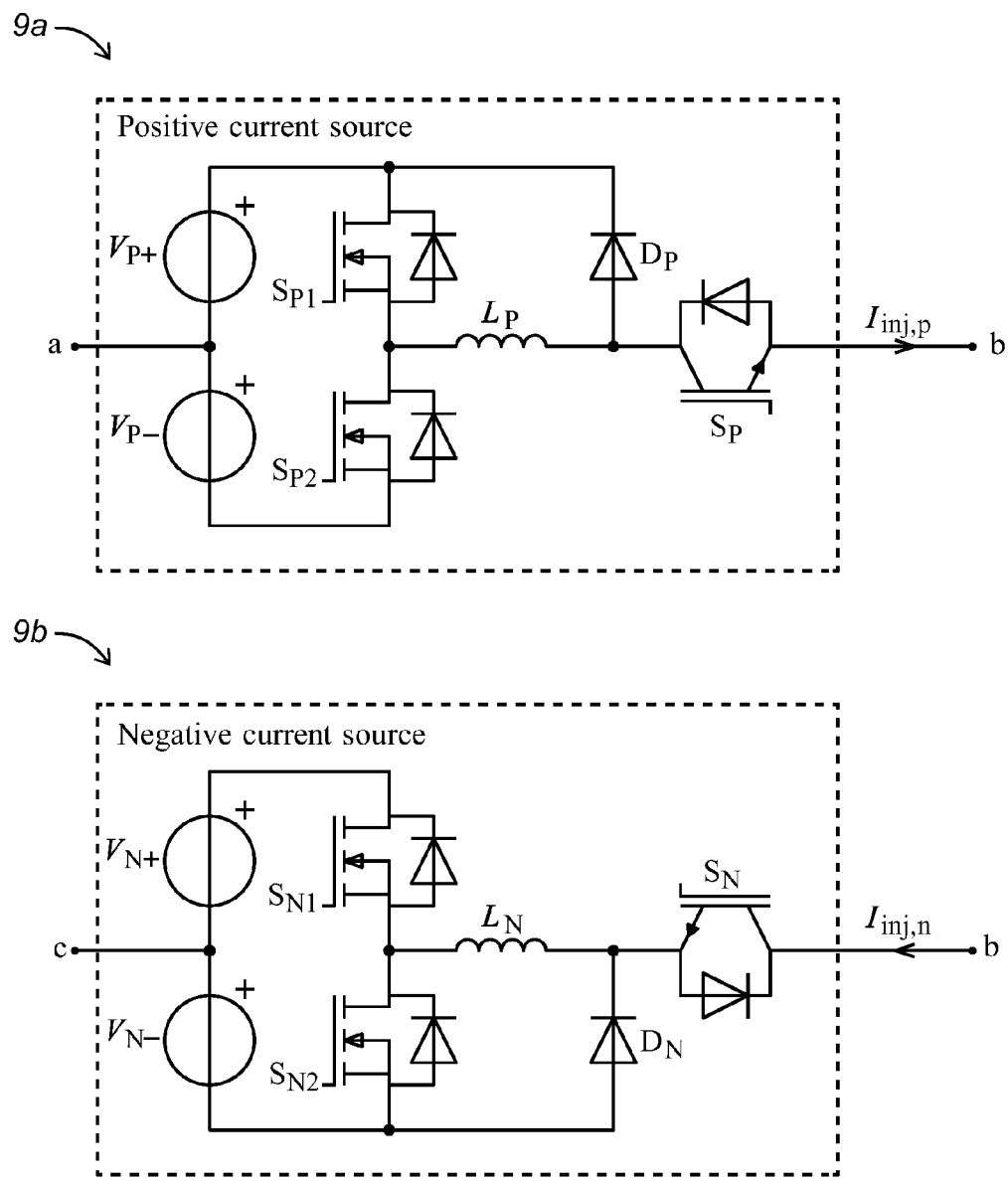
FIG. 9 shows a possible implementation of current sources.

FIG. 9 shows a possible implementation 9a, 9b of the current source, wherein "a", "b" and "c" indicate the terminals of the current sources, with "a" connected to the positive side of the bus voltage, "b" connected to the switch node and "c" connected to the negative side of the bus voltage. The current source comprises a series switch (SN and SP) added to the output of each current source to prevent a short circuit of the supply voltage UDC through the anti-parallel diode in the switches used in the current source. A comparator on the switch node voltage (Usn) is used to determine the switching moment between the positive and negative current source. Freewheeling diodes (DN and DP) are added to the output of the current source to provide a path when the series switch of the current source is switched off. The auxiliary voltage source in the current sources (VP+, VP−, VN+, VN−) are low voltage sources providing sufficient voltage to generate the required injection current.

Figure 10:
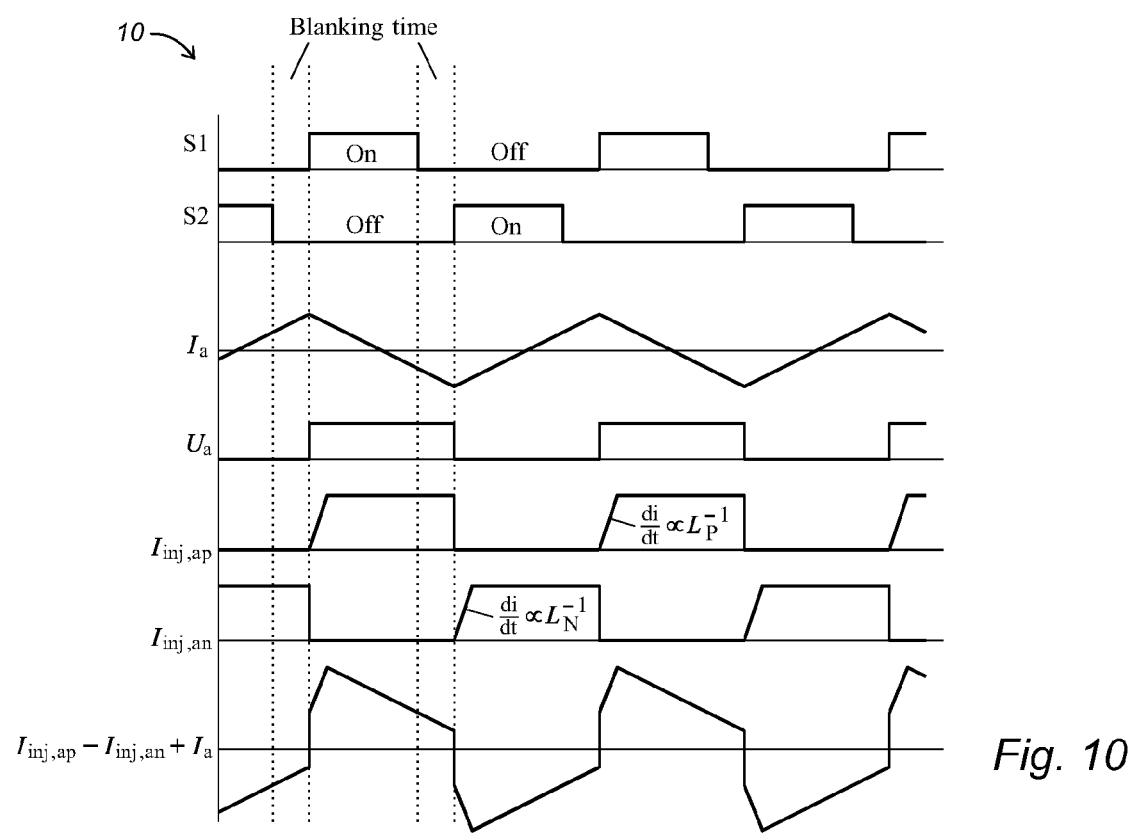
FIG. 10 shows waveforms corresponding to the H-bridge from FIG. 7 at zero load current.

FIG. 10 shows the resulting waveforms 10 of the circuit from FIG. 9, when the H-bridge is operating with zero load current.

Figure 11:
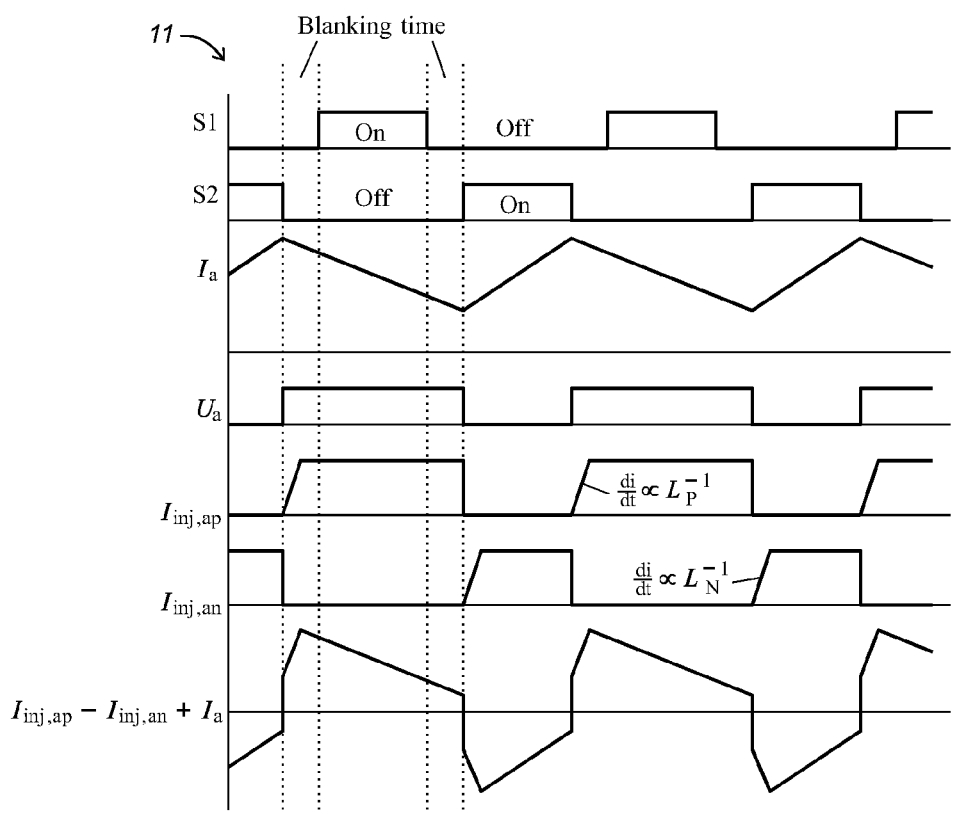
FIG. 11 shows waveforms corresponding to the H-bridge from FIG. 7 at a high load current.

FIG. 11 shows the waveforms 11 of the circuit from FIG. 9, when operating at a high load current.

The invention claimed is:

1. An electric power converter, comprising:
   at least a set of controllable power switches, arranged in an H-bridge or a functionally equivalent circuit comprising two switching legs of two series switches connected to a voltage source;
   a controller configured for controlling the switches with a blanking time and having a feedback loop for an output current of the electric power converter;
   a first bias current injection circuit, coupled to a central point of a first one of the two switching legs of the H-bridge; and
   a second bias current injection circuit, coupled to a central point of a second one of the two switching legs of the H-bridge; and
   wherein the first and second bias current injection circuits are configured for injecting a known bias current into a corresponding one of the two switching legs,
   wherein the bias current of the first and second bias current injection circuits are controlled such that the sum of the bias current and a current resulting from a voltage applied to a load via the H-bridge is negative at a transition from a conducting bottom switch to a conducting top switch and is positive at a transition from a conducting top switch to a conducting bottom switch.

2. The electric power converter according to claim 1, wherein each bias current injection circuit comprises a series connection of a positive current source and a negative current source, of which the central point is coupled to the central point of the corresponding leg of the H-bridge.

3. The electric power converter according to claim 1, comprising a plurality of stacked H-bridges.

4. An MRI system having an electric power converter, the electric power converter for driving gradient coils, the electric power converter, comprising:
   at least a set of controllable power switches, arranged in an H-bridge or a functionally equivalent circuit comprising two switching legs of two series switches connected to a voltage source;
   a controller configured for controlling the switches with a blanking time and having a feedback loop for an output current of the electric power converter;
   a first bias current injection circuit, coupled to a central point of a first one of the two switching legs of the H-bridge; and
   a second bias current injection circuit, coupled to a central point of a second one of the two switching legs of the H-bridge; and
   wherein the first and second bias current injection circuits are configured for injecting a known bias current into a corresponding one of the two switching legs,
   wherein the bias current of the first and second bias current injection circuits are controlled such that the sum of the bias current and a current resulting from a voltage applied to a load via the H-bridge is negative at a transition from a conducting bottom switch to a conducting top switch and is positive at a transition from a conducting top switch to a conducting bottom switch.

* * * * *

UNITED STATES PATENT AND TRADEMARK OFFICE
CERTIFICATE OF CORRECTION

PATENT NO. : 10,234,519 B2
APPLICATION NO. : 15/234136
DATED : March 19, 2019
INVENTOR(S) : Antonius Wilhelmus Hendricus Johannes Driessen and Noud Johan Hubert Slaats Page 1 of 1

It is certified that error appears in the above-identified patent and that said Letters Patent is hereby corrected as shown below:

On the Title Page

Insert:
--(30) Foreign Application Priority Data
August 13, 2015 (NL) ................................2015303--

Signed and Sealed this
Twenty-eighth Day of May, 2019

Andrei Iancu
*Director of the United States Patent and Trademark Office*